(12) United States Patent
Jones

(10) Patent No.: US 7,746,080 B2
(45) Date of Patent: Jun. 29, 2010

(54) SYSTEM AND METHOD FOR DETERMINING A POSITION OF A SINGLE PHASE FAULT TO GROUND IN A FEEDER LINE

(75) Inventor: Christopher G Jones, New York, NY (US)

(73) Assignee: Consolidated Edison Company of New York, Inc., New York, NY (US)

( * ) Notice: Subject to any disclaimer, the term of this patent is extended or adjusted under 35 U.S.C. 154(b) by 271 days.

(21) Appl. No.: 12/059,175

(22) Filed: Mar. 31, 2008

(65) Prior Publication Data

US 2009/0243623 A1 Oct. 1, 2009

(51) Int. Cl.
*G01R 31/08* (2006.01)
(52) U.S. Cl. .................................. 324/521; 324/525
(58) Field of Classification Search ............... 324/512, 324/521, 525; 361/80
See application file for complete search history.

(56) References Cited

U.S. PATENT DOCUMENTS 4,306,266 A * 12/1981 Born et al. ............... 361/80

* cited by examiner

*Primary Examiner*—Vincent Q Nguyen
(74) *Attorney, Agent, or Firm*—Cantor Colburn LLP

(57) ABSTRACT

A system and a method for determining a position of a single phase fault to ground in a feeder line are provided. The feeder line is electrically connected to an electrical substation via a substation bus. The system includes first and second sensors electrically coupled to a transformer in the electrical substation. The system further includes a processor that determines a reactance value based on measured electrical characteristics and a predetermined constant. The processor accesses a table having a plurality of position identifiers associated with positions on the feeder line, and a plurality of reactance component values corresponding to positions on the feeder line relative to the substation bus. The processor selects a first reactance component value from the plurality of reactance component values in the table to determine the position of a fault.

6 Claims, 3 Drawing Sheets

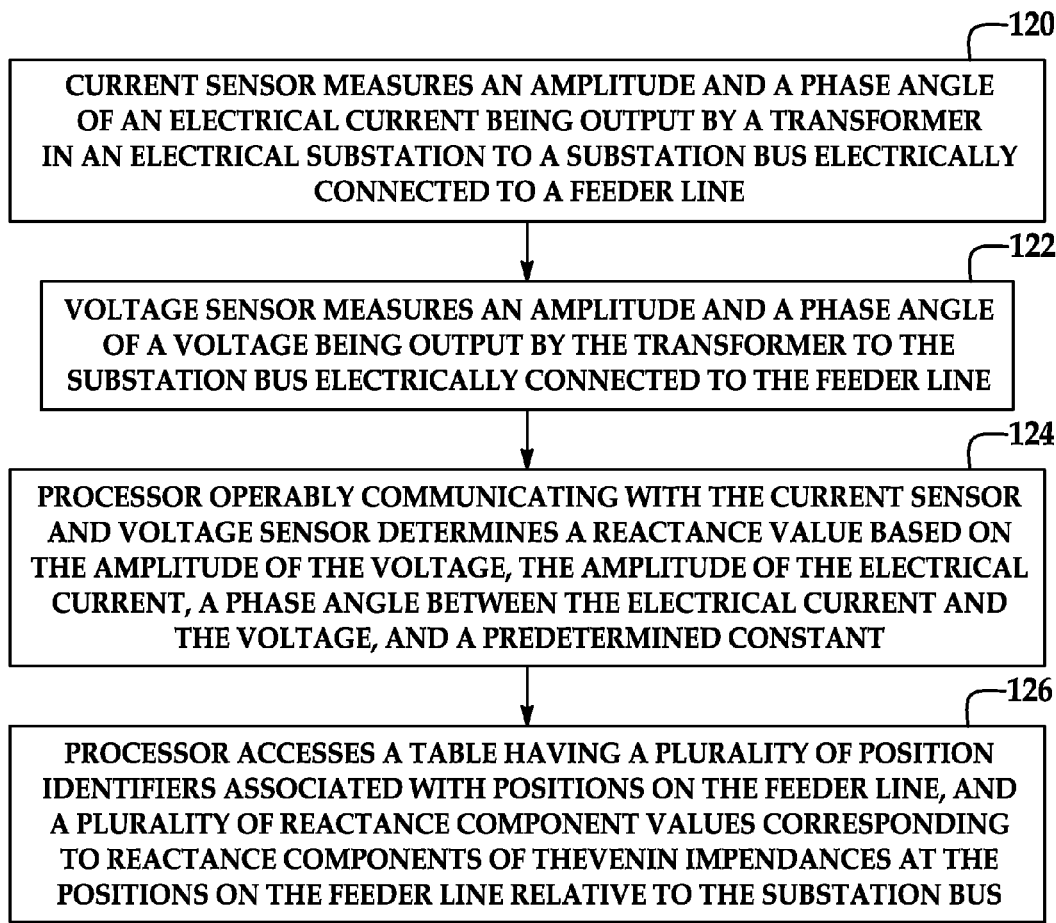

| POSITION IDENTIFIER | REACTANCE COMPONENT OF THE THEVENIN IMPEDANCE FROM SUBSTATION BUS TO SINGLE PHASE FAULT POSITION |
|---|---|
| A6 | 0.1 Ω |
| B6 | 0.2 Ω |
| C6 | 0.3 Ω |
| D6 | 1.0 Ω |

FIG. 2

120 — CURRENT SENSOR MEASURES AN AMPLITUDE AND A PHASE ANGLE OF AN ELECTRICAL CURRENT BEING OUTPUT BY A TRANSFORMER IN AN ELECTRICAL SUBSTATION TO A SUBSTATION BUS ELECTRICALLY CONNECTED TO A FEEDER LINE

122 — VOLTAGE SENSOR MEASURES AN AMPLITUDE AND A PHASE ANGLE OF A VOLTAGE BEING OUTPUT BY THE TRANSFORMER TO THE SUBSTATION BUS ELECTRICALLY CONNECTED TO THE FEEDER LINE

124 — PROCESSOR OPERABLY COMMUNICATING WITH THE CURRENT SENSOR AND VOLTAGE SENSOR DETERMINES A REACTANCE VALUE BASED ON THE AMPLITUDE OF THE VOLTAGE, THE AMPLITUDE OF THE ELECTRICAL CURRENT, A PHASE ANGLE BETWEEN THE ELECTRICAL CURRENT AND THE VOLTAGE, AND A PREDETERMINED CONSTANT

126 — PROCESSOR ACCESSES A TABLE HAVING A PLURALITY OF POSITION IDENTIFIERS ASSOCIATED WITH POSITIONS ON THE FEEDER LINE, AND A PLURALITY OF REACTANCE COMPONENT VALUES CORRESPONDING TO REACTANCE COMPONENTS OF THEVENIN IMPENDANCES AT THE POSITIONS ON THE FEEDER LINE RELATIVE TO THE SUBSTATION BUS (A)

SYSTEM AND METHOD FOR DETERMINING A POSITION OF A SINGLE PHASE FAULT TO GROUND IN A FEEDER LINE

BACKGROUND OF INVENTION

Power distribution systems have electrical substations that provide electricity to feeder lines. The feeder lines route the electricity to various parts of a metropolitan area. However, when a single phase fault to ground undesirably occurs in a feeder line, the routing of electricity through the feeder line may be interrupted. However, power line repairmen may have difficulty in finding a position of the single phase fault in the feeder line. Accordingly, the inventor herein has recognized that it would be beneficial to provide a system for automatically determining a position of the single phase fault in a feeder line.

SUMMARY OF THE INVENTION

A method for determining a position of a single phase fault to ground in a feeder line in accordance with an exemplary embodiment is provided. The feeder line is electrically connected to an electrical substation via a substation bus. The method includes measuring an amplitude and a phase angle of an electrical current being output by a transformer in the electrical substation to the substation bus electrically connected to the feeder line, utilizing a first sensor. The method further includes measuring an amplitude and a phase angle of a voltage being output by the transformer in the electrical substation to the substation bus electrically connected to the feeder line, utilizing a second sensor. The method further includes determining a reactance value based on the amplitude of the electrical current, the amplitude of the voltage, a phase angle between the electrical current and the voltage, and a predetermined constant, utilizing a processor. The method further includes accessing a table having a plurality of position identifiers associated with positions on the feeder line, and a plurality of reactance component values corresponding to reactance components of Thevenin impedances at the positions on the feeder line relative to the substation bus, utilizing the processor. The method further includes selecting a first reactance component value from the plurality of reactance component values in the table that substantially corresponds to the reactance value, utilizing the processor. The method further includes selecting a first position identifier from the plurality of position identifiers that is associated with the first reactance component value, utilizing the processor. The first position identifier indicates a first estimated position of the single phase fault to ground in the feeder line. The method further includes displaying the first position identifier on a display device, utilizing the processor.

A system for determining a position of a single phase fault to ground in a feeder line in accordance with another exemplary embodiment is provided. The feeder line is electrically connected to an electrical substation via a substation bus. The system includes a first sensor electrically coupled to a transformer in the electrical substation. The first sensor measures an amplitude and a phase angle of an electrical current being output by the transformer to the substation bus electrically connected to the feeder line. The system further includes a second sensor electrically coupled to the transformer in the electrical substation. The second sensor measures an amplitude and a phase angle of a voltage being output by the transformer to the substation bus electrically connected to the feeder line. The system further includes a processor operably communicating with the first and second sensors. The processor is configured to determine a reactance value based on the amplitude of the electrical current, the amplitude of the voltage, a phase angle between the electrical current and the voltage, and a predetermined constant. The processor is further configured to access a table having a plurality of position identifiers associated with positions on the feeder line, and a plurality of reactance component values corresponding to reactance components of Thevenin impedances at the positions on the feeder line relative to the substation bus. The processor is further configured to select a first reactance component value from the plurality of reactance component values in the table that substantially corresponds to the reactance value. The processor is further configured to select a first position identifier from the plurality of position identifiers that is associated with the first reactance component value. The first position identifier indicates a first estimated position of the single phase fault to ground in the feeder line. The processor is further configured to display the first position identifier on a display device.

BRIEF DESCRIPTION OF THE DRAWINGS

FIG. 2 is an exemplary table utilized by the fault detection system of FIG. 1; and FIGS. 3 and 4 are flowcharts of a method for determining a position of a single phase fault to ground in a feeder line utilizing the fault detection system of FIG. 1, in accordance with another exemplary embodiment.

DETAILED DESCRIPTION OF EXEMPLARY EMBODIMENTS

Figure 1:
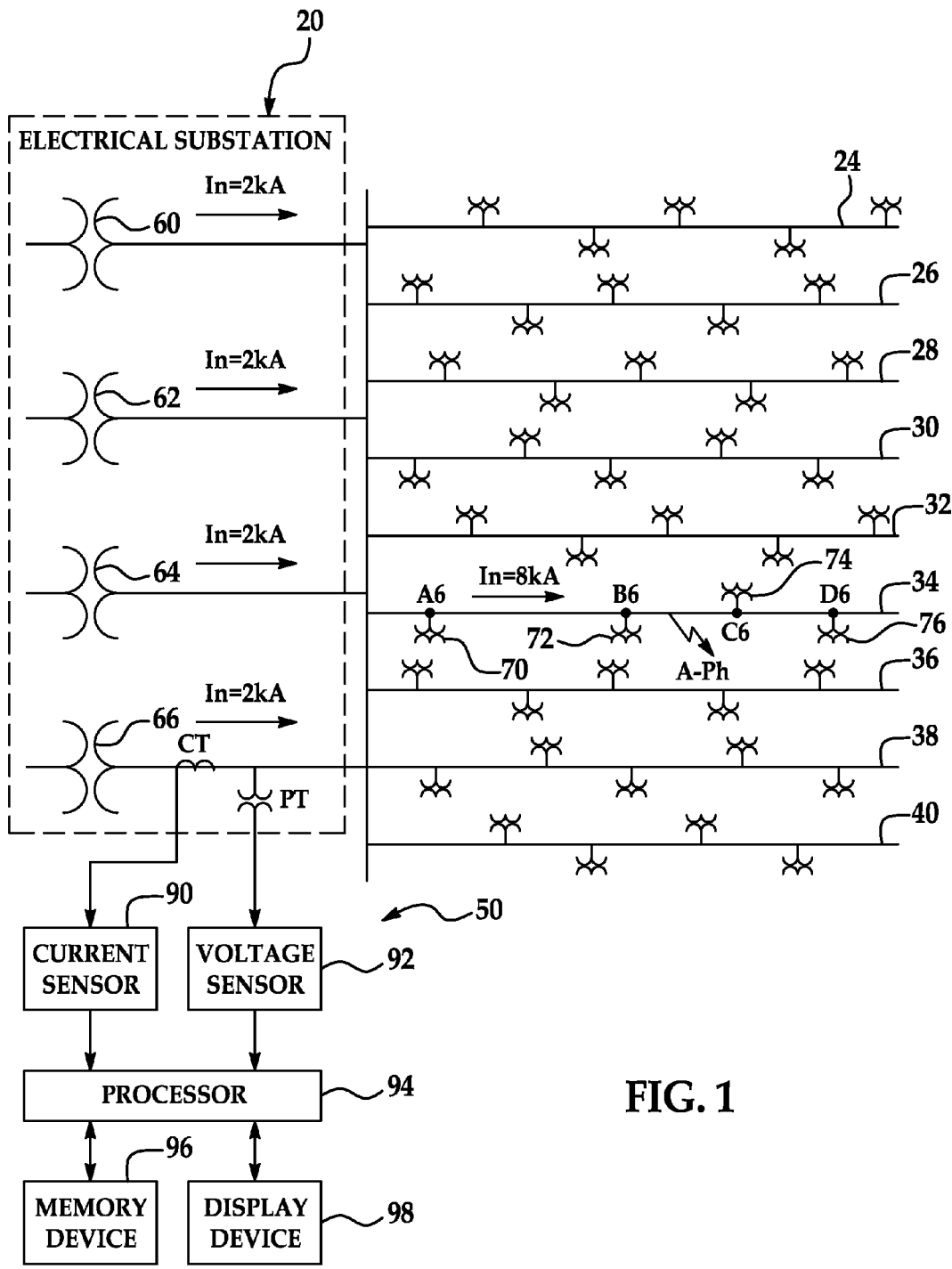
FIG. 1 is a schematic of a power distribution system having a fault detection system in accordance with an exemplary embodiment.

Referring to FIG. 1, a power distribution 10 for distributing electrical currents and voltages is illustrated. The power distribution 10 includes an electrical substation 20, a substation bus 22, feeder lines 24, 26, 28, 30, 32, 34, 36, 38, 40, and a fault detection system 50. An advantage of the fault detection system 50 is that the system can automatically determine a position of a single phase fault to ground in a feeder line.

The electrical substation 20 provides an electrical current and a voltage to the substation bus 22. The electrical substation 20 includes electrical transformers 60, 62, 64, 66. Each of the electrical transformers 60, 62, 64, 66 are electrically connected to the substation bus 22 and provide an electrical current and voltage to the substation bus 22.

The feeder lines 24, 26, 28, 30, 32, 34, 36, 38, 40 are provided to route electrical currents and voltages to various regions of a metropolitan area. Each of the feeder lines 24, 26, 28, 30, 32, 34, 36, 38, 40 is electrically connected to the substation bus 22.

The fault detection system 50 is provided to determine a position of a single phase fault to ground in one or more of the feeder lines 24, 26, 28, 30, 32, 34, 36, 38, 40. The fault detection system 50 includes a current sensor 90, a voltage sensor 92, a memory device 96, and a display device 98.

The current sensor 90 is electrically coupled to the transformer 66 in the electrical substation 20. The current sensor 90 measures an amplitude and a phase angle of the electrical current being output by the transformer 66 to the substation bus 22 and send signals to the processor 94 indicative of the amplitude and phase angle of the electrical current.

The voltage sensor 92 is electrically coupled to the transformer 66 in the electrical substation 20. The voltage sensor 92 measures an amplitude and a phase angle of a voltage being output by the transformer 66 to the substation bus 22 and send signals to the processor 94 indicative of the amplitude and phase angle of the voltage.

The processor 94 operably communicates with the current sensor 90, the voltage sensor 92, the memory device 96, and the display device 98. In one exemplary embodiment, the processor 94 is a computer. In another exemplary embodiment, the processor 94 is a microprocessor. The processor 94 is configured to determine a position of a single phase fault to ground in a feeder line, based on the signals from the current sensor 90 and the voltage sensor 92, as will be described in greater detail below. The processor 94 is configured to store data and values generated by the processor 94 in the memory device 96. Further, the processor 94 is configured to display data and values generated by the processor 94 on the display device 98.

Before providing a detailed explanation for determining a position of a single phase fault to ground in a feeder line, a general overview will be provided. Referring to FIG. 1, a feeder line 34 having electrical transformers 70, 72, 74, 76 is illustrated. The feeder line 34 further includes positions A6, B6, C6, and D6 disposed along the feeder line 34. Referring to FIG. 2, a table 110 is illustrated that includes: (i) position identifiers for positions along feeder line 34, and (ii) reactance components of Thevenin impedance from the substation bus 22 to single phase fault position associated with the feeder line 34. For example, as shown in the table 110, at the position identifier A6 on the feeder line 34, the reactance component of the Thevenin impedance from the substation bus 22 to the position A6 is equal to 0.1 ohms. Further, for example, when a single phase fault to ground occurs in the feeder line 34, the processor 94 could determine a reactance component of the Thevenin impedance is equal to 0.1 ohms based on signals from the current sensor 90 and the voltage sensor 92. Thereafter, the processor 94 could access the table 110 utilizing the calculated impedance of 0.1 ohms to determine that the position A6 on the feeder line 34 corresponds to the impedance of 0.1 ohms. It should be noted that in an alternative embodiment, the table 110 could include position identifiers and reactance components of Thevenin impedance from the substation bus to single phase fault positions, for each feeder line in a power distribution system. It should be further noted that the table 110 can be stored in the memory device 96.

Figure 4:
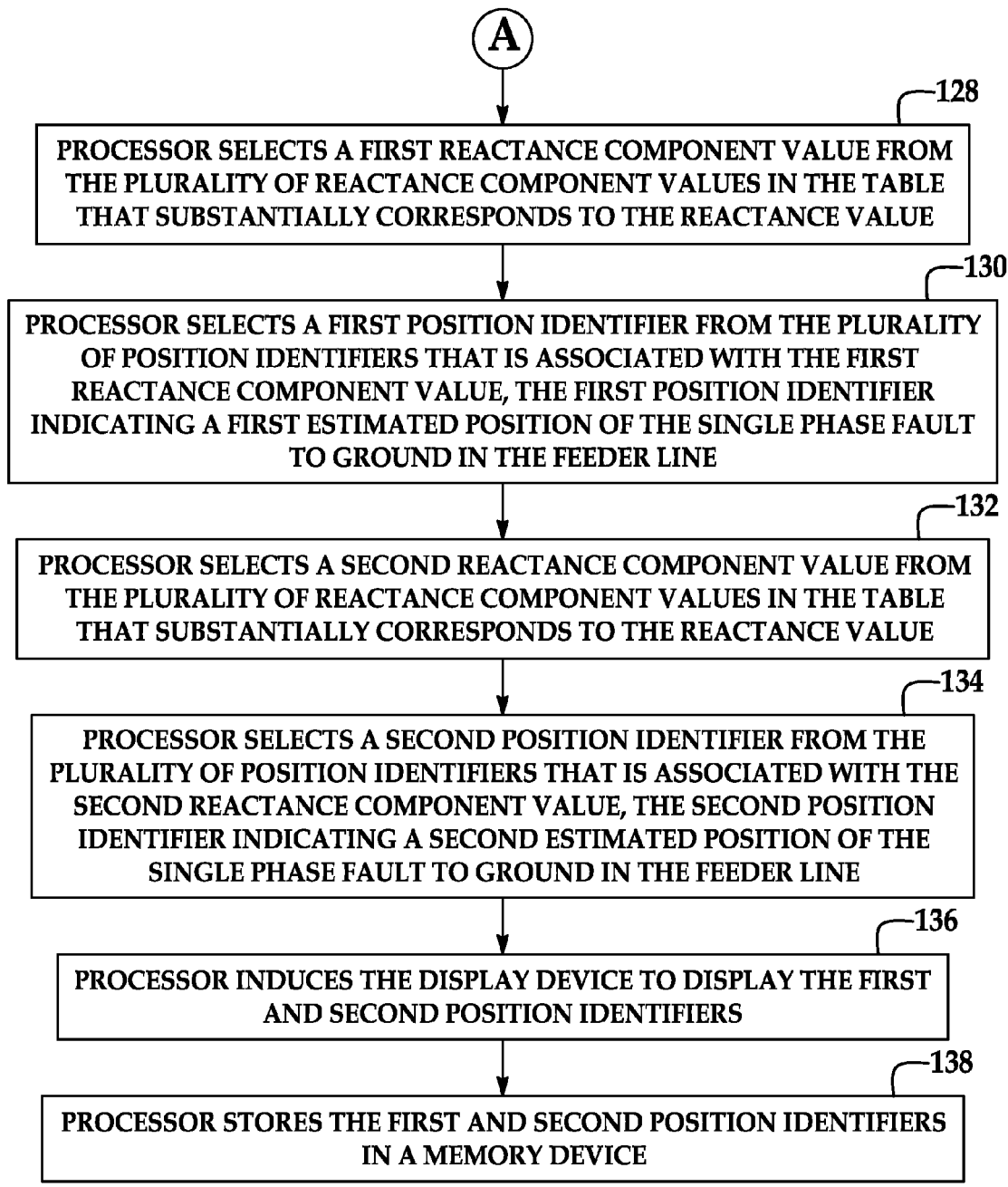

Referring to FIGS. 3 and 4, a flowchart of a method for determining a position of a single phase fault to ground in a feeder line utilizing the fault detection system 50 will now be explained. It should be noted that although the method will be explained as determining a position of a single phase fault to ground in the feeder line 34, the method could be utilized to determine the position of a single phase fault to ground in any feeder line of the power distribution system 10.

At step 120, the current sensor 90 measures an amplitude and a phase angle of an electrical current being output by the transformer 66 in the electrical substation 20 to the substation bus 22 electrically connected to the feeder line 34.

At step 122, the voltage sensor 92 measures an amplitude and a phase angle of a voltage being output by the transformer 66 to the substation bus 22 electrically connected to the feeder line 34.

At step 124, the processor 94 operably communicating with the current sensor 90 and the voltage sensor 92 determines a reactance value based on the following equation: reactance value=$V/(n*I)*SIN(\Theta-\Phi)*K$, where V corresponds to the amplitude of the voltage, n corresponds to a number of supplying transformers operating in parallel to the electrical substation 20, I corresponds to the amplitude of the electrical current, $\Phi$ corresponds to a phase angle of the current, and $\Theta$ corresponds to a phase angle of the voltage, and $\Theta-\Phi$ corresponds to a phase angle between the electrical current and the voltage, and K corresponds to a predetermined constant that is empirically determined. For example, the processor 94 could determine a reactance value of 0.12 ohms.

At step 126, the processor 94 accesses the table 110 having a plurality of position identifiers associated with positions on the feeder line 34, and a plurality of reactance component values corresponding to reactance components of Thevenin impedances at the positions on the feeder line 34 relative to the substation bus 22.

At step 128, the processor 94 selects a first reactance component value from the plurality of reactance component values in the table 110 that substantially corresponds to the reactance value. For example, the processor could select the reactance component value of 0.1 ohms from table 110 that substantially corresponds the reactance value of 0.12 ohms.

At step 130, the processor 94 selects a first position identifier from the plurality of position identifiers that is associated with the first reactance component value. The first position identifier indicates a first estimated position of the single phase fault to ground in the feeder line 34. For example, processor 94 could select the position identifier A6 that is associated with the reactance component value of 0.1 ohms.

At step 132, the processor 94 selects a second reactance component value from the plurality of reactance component values in the table 110 that substantially corresponds to the reactance value. For example, the processor could select the reactance component value of 0.2 ohms from table 110 that substantially corresponds the reactance value of 0.12 ohms.

At step 134, the processor 94 selects a second position identifier from the plurality of position identifiers that is associated with the second reactance component value. The second position identifier indicates a second estimated position of the single phase fault to ground in the feeder line 34. For example, the processor 94 could select the position identifier B6 that is associated with the reactance component value of 0.2 ohms.

At step 136, the processor 94 induces the display device 98 to display the first and second position identifiers. For example, the processor 94 could induce the display device 98 to display the position identifiers A6, B6.

At step 138, the processor 94 stores the first and second position identifiers in the memory device 96. For example, the processor 94 could store the position identifiers position identifiers A6, B6 in the memory device 96.

The system and method for determining a position of a single phase fault to ground in a feeder line represent a substantial advantage over other systems and methods. In particular, the system and method provide a technical effect of determining the position of a single phase fault to ground in a feeder line based on an electrical current and a voltage being output by a transformer in an electrical substation electrically connected through a substation bus to the feeder line.

While the invention has been described with reference to exemplary embodiments, it will be understood by those skilled in the art that various changes may be made and equivalent elements may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying this invention, but that the invention will include all embodiments falling within the scope of the appended claims. Moreover, the use of the terms, first, second, etc. are used to distinguish one element from another. Furthermore, the use of the terms a, an, etc. do not denote a limitation of quantity, but rather denote the presence of at least one of the referenced items.

What is claimed is:

1. A method for determining a position of a single phase fault to ground in a feeder line, the feeder line electrically connected to an electrical substation via a substation bus, the method comprising:

measuring an amplitude and a phase angle of an electrical current being output by a transformer in the electrical substation to the substation bus electrically connected to the feeder line, utilizing a first sensor;

measuring an amplitude and a phase angle of a voltage being output by the transformer in the electrical substation to the substation bus electrically connected to the feeder line, utilizing a second sensor;

determining a reactance value based on the amplitude of the electrical current, the amplitude of the voltage, a phase angle between the electrical current and the voltage, and a predetermined constant, utilizing a processor;

accessing a table having a plurality of position identifiers associated with positions on the feeder line, and a plurality of reactance component values corresponding to reactance components of Thevenin impedances at the positions on the feeder line relative to the substation bus, utilizing the processor;

selecting a first reactance component value from the plurality of reactance component values in the table that substantially corresponds to the reactance value, utilizing the processor;

selecting a first position identifier from the plurality of position identifiers that is associated with the first reactance component value, utilizing the processor, the first position identifier indicating a first estimated position of the single phase fault to ground in the feeder line; and displaying the first position identifier on a display device, utilizing the processor.

2. The method of claim 1, further comprising storing the first position identifier in a memory device, utilizing the processor.

3. The method claim 1, further comprising:

selecting a second reactance component value from the plurality of reactance component values in the table that substantially corresponds to the reactance value, utilizing the processor;

selecting a second position identifier from the plurality of position identifiers that is associated with the second reactance component value, utilizing the processor, the second position identifier indicating a second estimated position of the single phase fault to ground in the feeder line; and displaying the second position identifier on the display device, utilizing the processor.

4. A system for determining a position of a single phase fault to ground in a feeder line, the feeder line electrically connected to an electrical substation via a substation bus, the system comprising:

a first sensor electrically coupled to a transformer in the electrical substation, the first sensor measuring an amplitude and a phase angle of an electrical current being output by the transformer to the substation bus electrically connected to the feeder line;

a second sensor electrically coupled to the transformer in the electrical substation, the second sensor measuring an amplitude and a phase angle of a voltage being output by the transformer to the substation bus electrically connected to the feeder line; and a processor operably communicating with the first and second sensors, the processor configured to determine a reactance value based on the amplitude of the electrical current, the amplitude of the voltage, a phase angle between the electrical current and the voltage, and a predetermined constant, the processor further configured to access a table having a plurality of position identifiers associated with positions on the feeder line, and a plurality of reactance component values corresponding to reactance components of Thevenin impedances at the positions on the feeder line relative to the substation bus, the processor further configured to select a first reactance component value from the plurality of reactance component values in the table that substantially corresponds to the reactance value, the processor further configured to select a first position identifier from the plurality of position identifiers that is associated with the first reactance component value, the first position identifier indicating a first estimated position of the single phase fault to ground in the feeder line, the processor further configured to display the first position identifier on a display device.

5. The system of claim 4, wherein the processor is further configured to store the first position identifier in a memory device.

6. The system of claim 4, wherein the processor is further configured to select a second reactance component value from the plurality of reactance component values in the table that substantially corresponds to the reactance value, the processor further configured to select a second position identifier from the plurality of position identifiers that is associated with the second reactance component value, the second position identifier indicating a second estimated position of the single phase fault to ground in the feeder line, the processor further configured to display the second position identifier on the display device.

* * * * *